(12) United States Patent
Feng et al.

(10) Patent No.: US 11,056,430 B1
(45) Date of Patent: Jul. 6, 2021

(54) THIN FILM BASED SEMICONDUCTOR DEVICES AND METHODS OF FORMING A THIN FILM BASED SEMICONDUCTOR DEVICE

(71) Applicant: GLOBALFOUNDRIES Singapore Pte. Ltd., Singapore (SG)

(72) Inventors: Chengang Feng, Singapore (SG); Handoko Linewih, Singapore (SG); Yanxia Shao, Singapore (SG); Yudi Setiawan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/813,835

(22) Filed: Mar. 10, 2020

(51) Int. Cl.
| | |
|---|---|
| *H01L 23/522* | (2006.01) |
| *H01L 23/532* | (2006.01) |
| *H01L 21/768* | (2006.01) |
| *H01L 21/311* | (2006.01) |
| *H01L 49/02* | (2006.01) |
| *H01L 23/528* | (2006.01) |

(52) U.S. Cl.
CPC .... *H01L 23/5228* (2013.01); *H01L 21/31111* (2013.01); *H01L 21/76802* (2013.01); *H01L 21/76877* (2013.01); *H01L 23/528* (2013.01); *H01L 23/5226* (2013.01); *H01L 23/53295* (2013.01); *H01L 28/20* (2013.01)

(58) Field of Classification Search
CPC ... H01L 23/5228; H01L 28/20; H01L 23/528; H01L 21/31111; H01L 21/76877; H01L 23/5226; H01L 23/53295; H01L 21/76802
See application file for complete search history.

(56) References Cited

U.S. PATENT DOCUMENTS

| | | | |
|---|---|---|---|
| 6,081,014 A | 6/2000 | Redford et al. | |
| 6,329,234 B1 | 12/2001 | Ma et al. | |
| 8,080,461 B2 | 12/2011 | Yeh et al. | |
| 9,627,467 B2 | 4/2017 | Tseng et al. | |

(Continued)

OTHER PUBLICATIONS

Kwon et al., "Process Optimization of Integrated SiCr Thin-Film Resistor for High-Performance Analog Circuits", IEEE Transactions on Electron Devices, Jan. 2014, pp. 8-14, vol. 61, No. 1, IEEE.

(Continued)

*Primary Examiner* — Karen Kusumakar
(74) *Attorney, Agent, or Firm* — Viering Jentschura & Partner mbB

(57) ABSTRACT

According to various embodiments, a semiconductor device may include a thin film arranged within a first inter-level dielectric layer, a masking region, and a contact plug. The masking region may be arranged over the thin film, within the first inter-level dielectric layer. The masking region may be structured to have a higher etch rate than the first inter-level dielectric layer. The contact plug may extend along a vertical axis, from a second inter-level dielectric layer to the thin film. A bottom portion of the contact plug may be surrounded by the masking region. The bottom portion of the contact plug may include a lateral member that extends along a horizontal plane at least substantially perpendicular to the vertical axis. The lateral member may be in contact with the thin film.

20 Claims, 15 Drawing Sheets

(56) References Cited

U.S. PATENT DOCUMENTS

| | | | |
|---|---|---|---|
| 2013/0234333 A1* | 9/2013 | Cheng | H01L 23/535 |
| | | | 257/751 |
| 2015/0318280 A1 | 11/2015 | Mun et al. | |
| 2017/0110496 A1* | 4/2017 | Lin | H01L 27/1464 |
| 2020/0203272 A1* | 6/2020 | Doebler | H01L 21/76804 |
| 2021/0098363 A1 | 4/2021 | Linewih et al. | |

OTHER PUBLICATIONS

Brynsvold et al., "Constant-Current Stressing of SiCr-Based Thin-Film Resistors: Initial "Wearout" Investigation", IEEE Transactions on Device and Materials Reliability, Jun. 2007, pp. 259-269, vol. 7, No. 2, IEEE.

Li et al., "A novel degradation mechanism in SiCr—O based thin film resistors under temperature and current stress", 2012 IEEE International Reliability Physics Symposium (IRPS), 2012, 6 pages, IEEE.

\* cited by examiner

US 11,056,430 B1

THIN FILM BASED SEMICONDUCTOR DEVICES AND METHODS OF FORMING A THIN FILM BASED SEMICONDUCTOR DEVICE

TECHNICAL FIELD

Various embodiments relate to thin film based semiconductor devices and methods of forming a thin film based semiconductor device.

BACKGROUND

Thin film based passive components such as thin film resistors (TFRs) are employed in high precision analog and mixed signal or radio frequency applications. For example, TFRs are mostly used as part of a complex integrated circuit to provide high precision resistance in a device having low temperature coefficient of resistance (TCR). Generally, special care may be required in the fabrication process of such thin film based devices. For example, the process to contact the overlying metal interconnect layer and the TFR in a conventional top side via pick-up configuration may result in the TFR being punched through when the via is formed, which may yield to high contact resistance, increase the TCR and high variability resistance within the wafer. Prior art fabrication processes to prevent the punch through may include forming a buffer layer on top of the thin film, or to form a liner before forming the TFR for bottom side via pick-up configurations. These fabrication processes, however, require additional masks and increases the complexity of the fabrication process.

SUMMARY

According to various embodiments, there may be provided a semiconductor device. The semiconductor device may include a thin film arranged within a first inter-level dielectric layer (ILD), a masking region, and a contact plug. The masking region may be arranged over the thin film, within the first ILD layer. The masking region may be structured to have a higher etch rate than the first ILD layer. The contact plug may extend along a vertical axis, from a second ILD layer to the thin film. A bottom portion of the contact plug may be surrounded by the masking region. The bottom portion of the contact plug may include a lateral member that extends along a horizontal plane at least substantially perpendicular to the vertical axis. The lateral member may be in contact with the thin film.

According to various embodiments, there may be provided a method of forming a semiconductor device. The method may include arranging a thin film within a first ILD layer. The method may include arranging a masking region over the thin film, within the first ILD layer. The masking region may be structured to have a higher etch rate than the first ILD layer. The method may include forming a contact plug. The contact plug may extend along a vertical axis, from a second ILD layer to the thin film. A bottom portion of the contact plug may be surrounded by the masking region. The bottom portion of the contact plug may include a lateral member that extends along a horizontal plane at least substantially perpendicular to the vertical axis. The lateral member may be in contact with the thin film.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

Figure 1A:
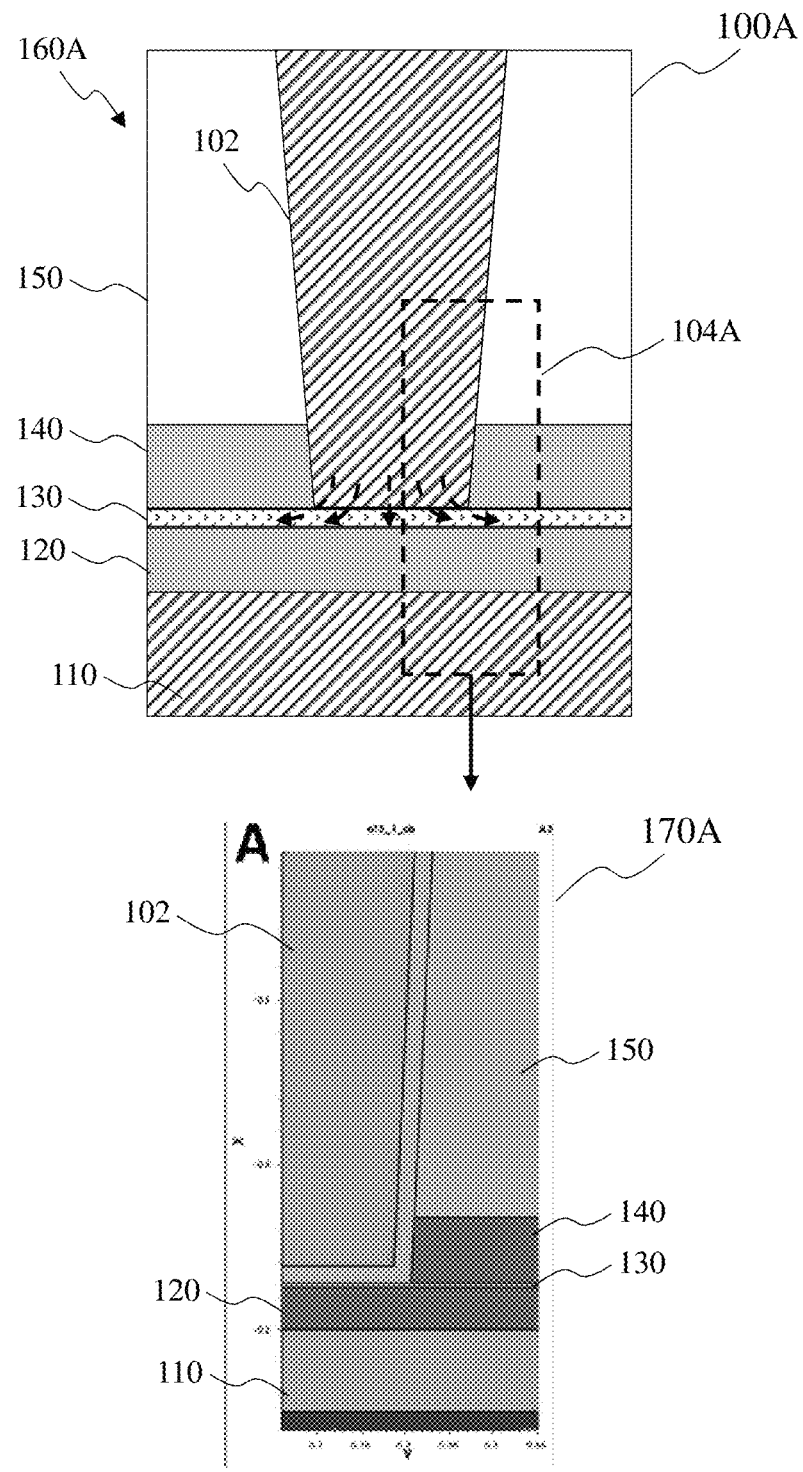
FIG. 1A shows a partial cross-sectional view of a semiconductor device and an enlarged view of a region marked out in the partial cross-sectional view.
Figure 2A:
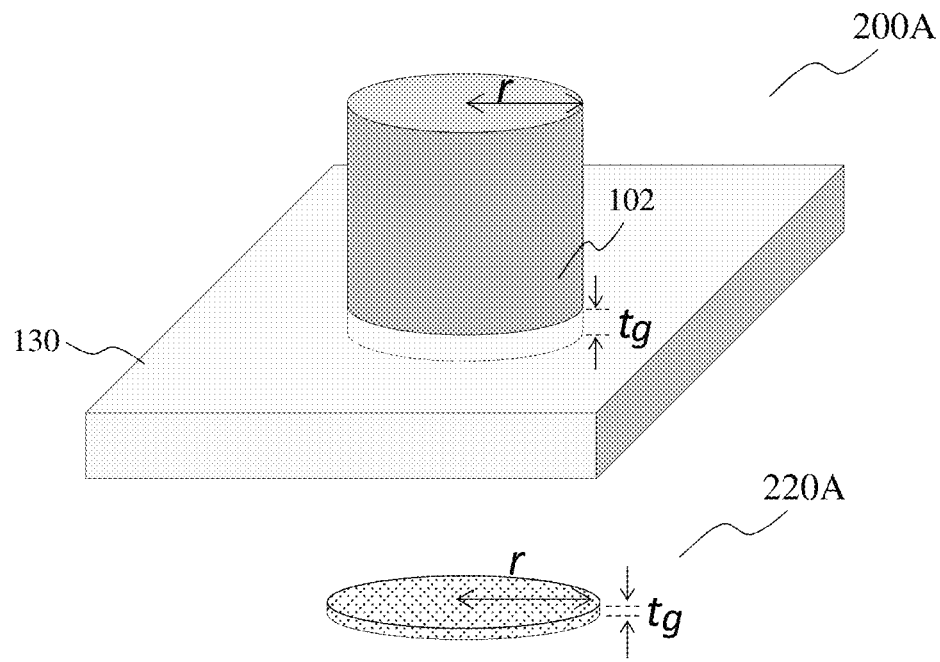
FIG. 2A shows a simplified perspective view of an arrangement of a contact plug with respect to a thin film in the semiconductor device of FIG. 1A.

FIG. 1A shows a partial cross-sectional view 100A of a semiconductor device 160A, as well as an enlarged view 170A of a region 104A marked out in the cross-sectional view 100A. The semiconductor device 160A may include a thin film 130, and hence, may also be referred herein as a thin film based device, or simply, thin film device. The semiconductor device 160A may include a conductor 110, an insulator layer 120, the thin film 130, a barrier member 140, and an inter-level dielectric (ILD) layer 150. The insulator layer 120 may be arranged over the conductor 110. The thin film 130 may be arranged over the insulator layer 120. The barrier member 140 may be arranged over the thin film 130. The ILD layer 150 may be arranged over the barrier member 140. The barrier member 140 and the thin film 130 may be provided within the ILD layer 150. The semiconductor device 160A may include a contact plug 102, also referred herein as an interconnect via, which is formed of a conductive material. The contact plug 102 may extend through a thickness of the ILD layer 150, and further extend through a thickness of the barrier member 140, to reach the thin film 130. In the semiconductor device 160A, the contact plug 102 may contact a top surface of the thin film 130, without extending into the thin film 130. The top surface of the thin film 130 may face the barrier member 140. Alternatively, the contact plug 102 may extend slightly into the thin film 130 by a miniscule depth, as illustrated in FIG. 2A. The thin film 130 may have a substantially uniform thickness across a plane that is parallel to each of the conductive layer 110, the first insulator layer 120, and the barrier member 140. In the enlarged view 170A, it can be seen that the thin film 130 is much thinner as compared to the adjacent layers. As such, it is challenging to form the contact plug 102 such that the contact plug 102 does not extend through the thin film 130.

Figure 1B:
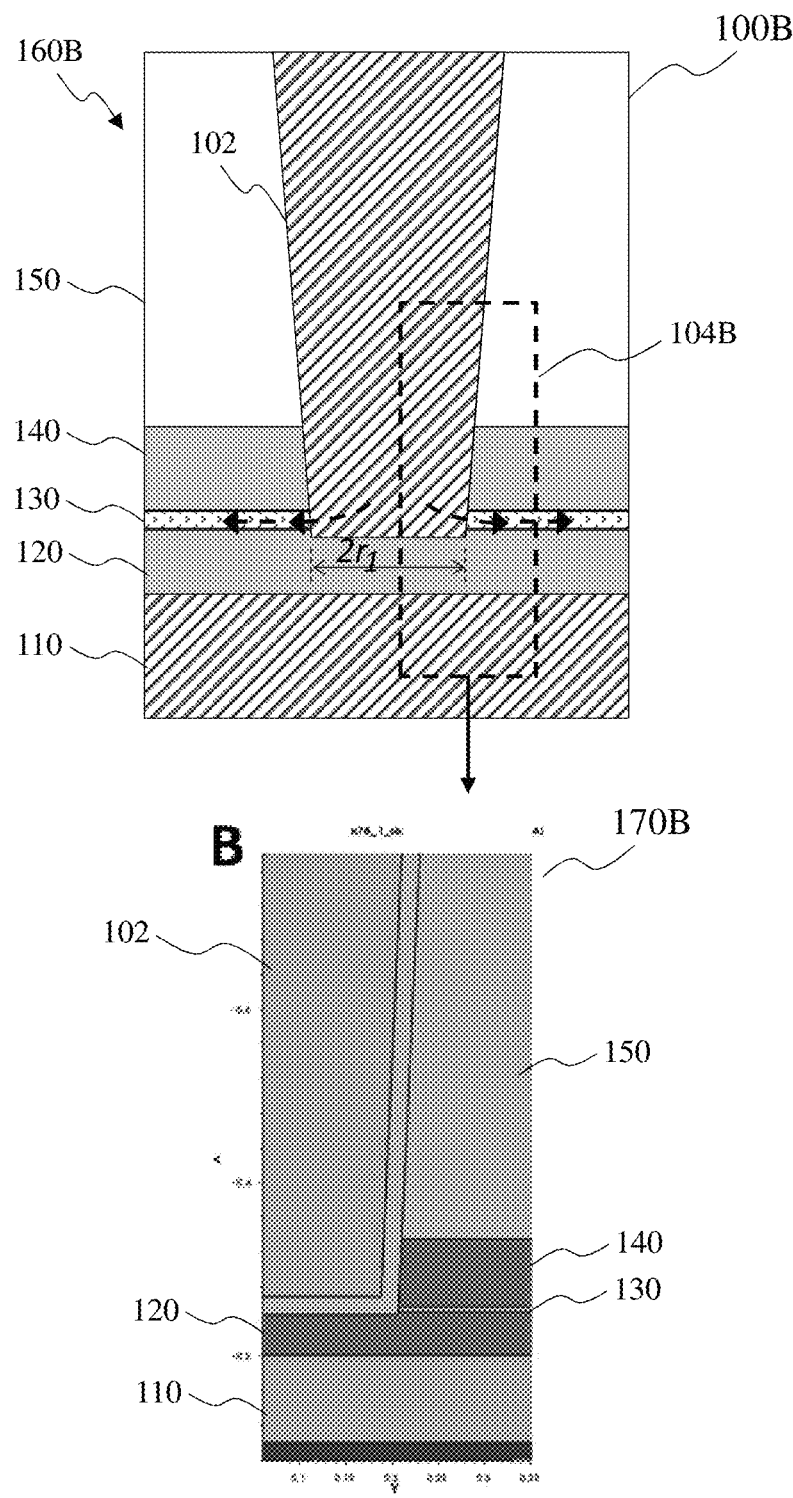
FIG. 1B shows a partial cross-sectional view of another semiconductor device and an enlarged view of a region marked out in the partial cross-sectional view.

FIG. 1B shows a partial cross-sectional view 100B of a semiconductor device 160B, as well as an enlarged view 170B of a region 104B marked out in the cross-sectional view 100B. The semiconductor device 160B may be similar in structure to the semiconductor device 160A, except for the arrangement of the contact plug 102. In the thin film device 160B, the contact plug 102 punches through the thin film 130. In other words, the contact plug 102 extends through the thickness of the ILD layer 150, the thickness of barrier member 140, as well as the thickness of the thin film 130, to reach the first insulator layer 120.

FIG. 2A shows a simplified perspective view 200A of the arrangement of the contact plug 102 with respect to the thin film 130, in the semiconductor device 160A. As described with respect to FIG. 1A, the contact plug 102 either abuts a top surface of the thin film 130 or partially extends into the thin film 130. FIG. 2A also shows a perspective view 220A of a surface area of contact between the contact plug 102 and the thin film 130, in the semiconductor device 160A. The radius of the contact plug 102 at the interface between the contact plug 102 and the thin film 130, is denoted as r. The depth by which the contact plug 102 penetrates into the thin film 130 is denoted as $t_g$. The surface area of contact between the contact plug 102 and the thin film 130 in the semiconductor device 160A, $A_{160A}$, may be expressed as:

$$A_{160A} = \pi \cdot r^2 + 2\pi \cdot r \cdot t_g \quad (1)$$

Figure 2B:
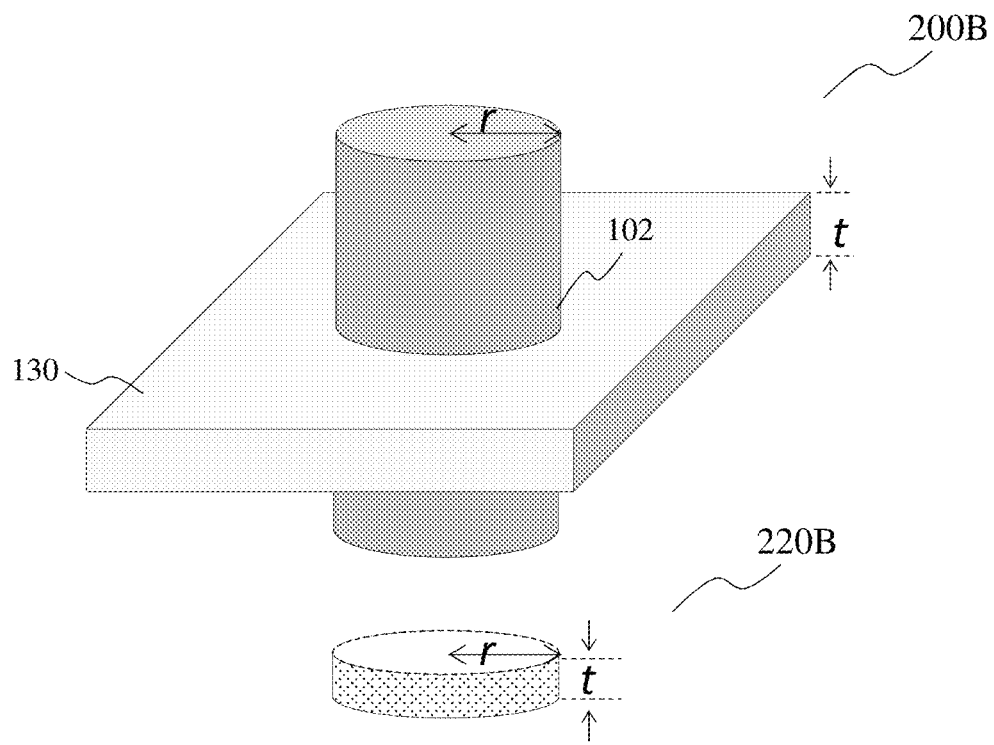
FIG. 2B shows a simplified perspective view of an arrangement of a contact plug with respect to a thin film in the semiconductor device of FIG. 1B.

FIG. 2B shows a simplified perspective view 200B of the arrangement of the contact plug 102 with respect to the thin film 130, in the semiconductor device 160B. As described with respect to FIG. 1B, the contact plug 102 punches through the thin film 130. FIG. 2B also shows a perspective view 220B of a surface area of contact (shown with shading) between the contact plug 102 and the thin film 130, in the semiconductor device 160B. Like in FIG. 2A, the radius of the contact plug 102 at the interface between the contact plug 102 and the thin film 130, is denoted as r. The thickness of the thin film 130 is denoted as t. The surface area of contact between the contact plug 102 and the thin film 130 in the semiconductor device 160B, $A_{160B}$, may be expressed as:

$$A_{160B} = 2\pi \cdot r \cdot t \quad (2)$$

The surface area of contact $A_{160A}$ in the semiconductor device 160A may generally be substantially larger than the surface of contact $A_{160B}$ in the semiconductor device 160B, as t is substantially smaller than r. As an example, the thickness of the thin film 130, t, may be about 5 nm; while the radius of the contact plug 102 at the interface between the contact plug 102 and the thin film 130, r, may be about 0.2 μm. Assuming that the contact plug 102 in the semiconductor device 160A does not penetrate into the thin film 130, i.e. $t_g=0$, applying Equations (1) and (2), $A_{160A}=0.1256$ μm² while $A_{160B}=0.006283$ μm². The surface area of contact between the contact plug 102 and the thin film 130 in the semiconductor device 160A may be about 20 times larger than that in the semiconductor device 160B. The effects of the difference in surface area of contact are discussed with respect to FIGS. 3A and 3B.

Figure 3A:
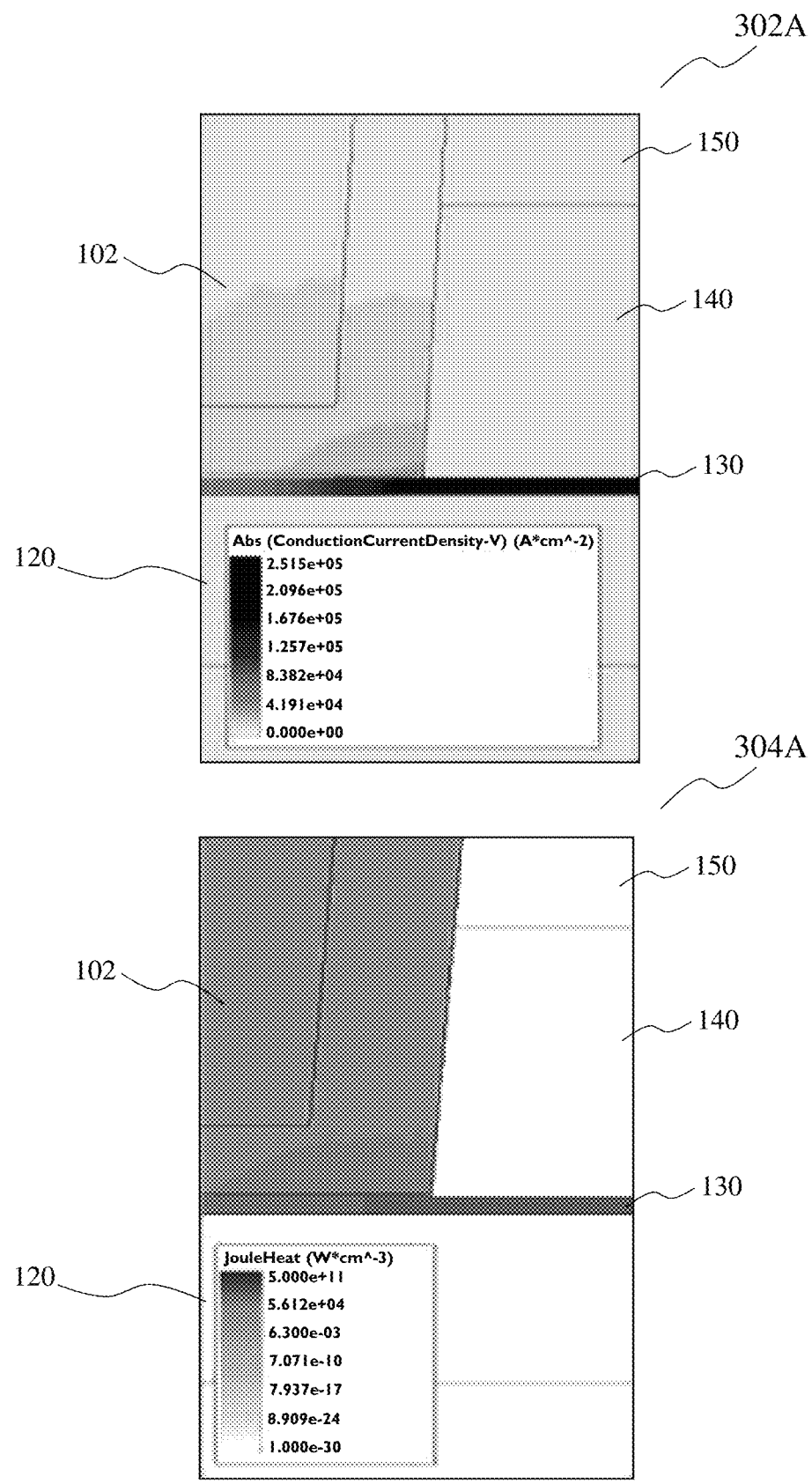
FIG. 3A shows a first graph presenting simulated current density in the cross-sectional view of the semiconductor device of FIG. 1A, and a second graph presenting simulated Joule heating effect in the cross-sectional view of the semiconductor device of FIG. 1A.

FIG. 3A shows a first graph 302A presenting simulated current density in the cross-sectional view 170A of the semiconductor device 160A, and a second graph 304A presenting simulated Joule heating effect in the cross-sectional view 170A of the semiconductor device 160A.

Figure 3B:
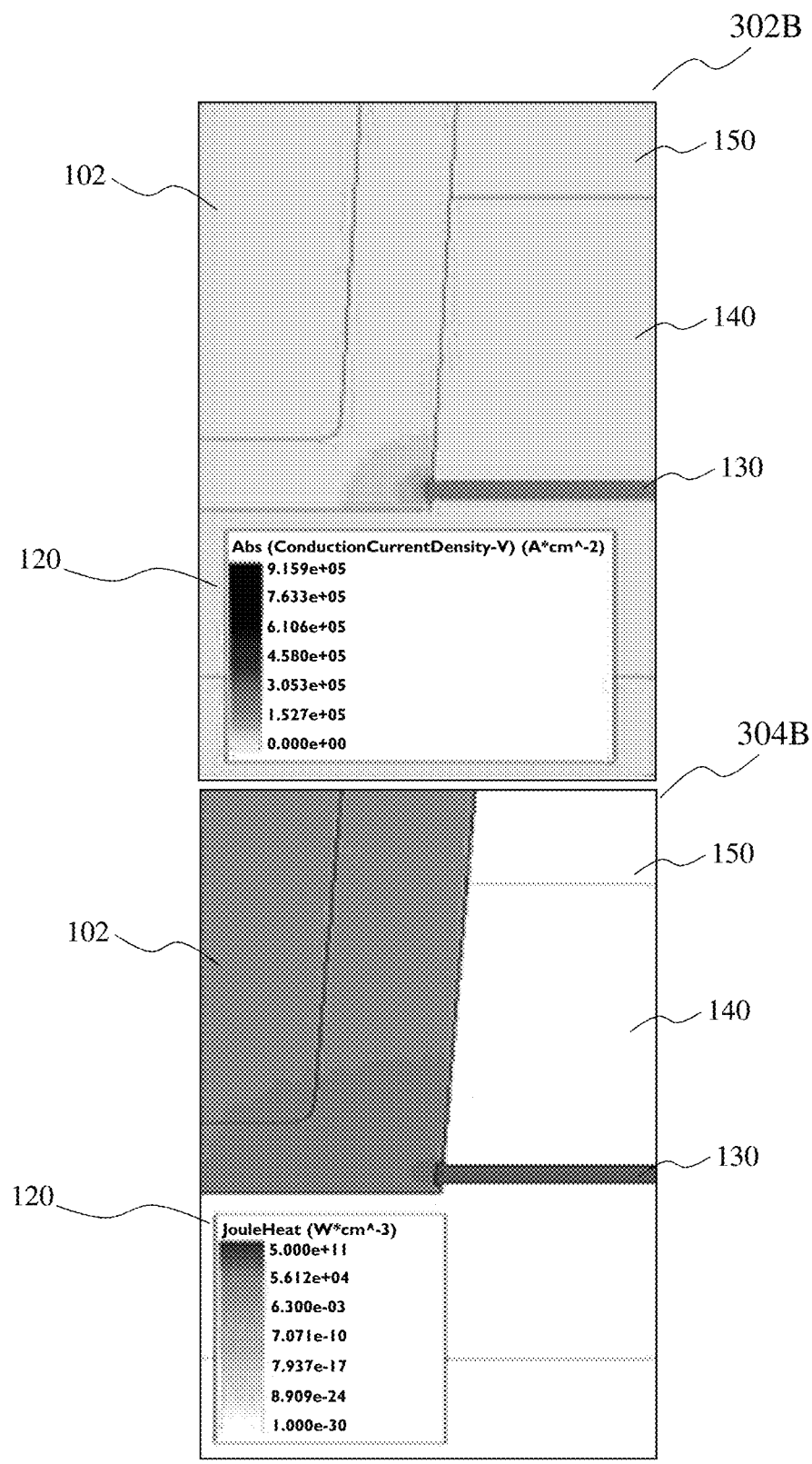
FIG. 3B shows a first graph presenting simulated current density in the cross-sectional view of the semiconductor device of FIG. 1B, and a second graph presenting simulated Joule heating effect in the cross-sectional view of the semiconductor device of FIG. 1B.

FIG. 3B shows a first graph 302B presenting simulated current density in the cross-sectional view 170B of the semiconductor device 160B, and a second graph 304B presenting simulated Joule heating effect in the cross-sectional view 170B of the semiconductor device 160B.

Comparing the graphs 302A and 302B, the current density at the interface between the thin film 130 and the contact plug 102 is higher in the semiconductor device 160B than in the semiconductor device 160A. Similarly, the graphs 304A and 304B show that the amount of Joule heating in the thin film 130 is higher in the semiconductor device 160B than in the semiconductor device 160A. The higher amount of Joule heating degrades the TCR of the semiconductor device 160B.

Referring back to the cross-sectional view 100A in FIG. 1A, the arrows show the current flow from the contact plug 102 to the thin film 130. Electrical current may exit from the contact plug 102 into the thin film 130 over the entire base area of the contact plug 102. Referring to the cross-sectional view 100B in FIG. 1B, the current flow may be confined to exiting a narrow side surface area of the contact plug 102 that adjoins the thin film 130. As a consequence, the semiconductor device 160B may suffer from higher current density at the interface between the thin film 130 and the contact plug 102, as well as a larger amount of Joule heating in the thin film 130, as compared to the semiconductor device 160A, due to its smaller surface area of contact between the contact plug 102 and the thin film 130.

As such, it may be desirable to increase the surface area of contact between the contact plug 102 and the thin film 130. While the semiconductor device 160A may be superior to the semiconductor device 160B in this aspect, the process to fabricate the semiconductor device 160A require two mask adders. The process to fabricate the semiconductor device 160A may require a first mask for defining the area (i.e. the length and the width) of the thin film 130 for making a thin film resistor, and may require a second mask for a dedicated contact trench tuned process or to provide additional hard material on top of the thin film 130 to serve as an etch buffer. In comparison, the process to fabricate the semiconductor device 160B may only require the first mask for defining the area of the thin film 130 for making the thin film resistor. An improved semiconductor device that may be fabricated using only one mask adder, while achieving a larger surface area of contact between the thin film 130 and the contact plug 102, is described with respect to FIG. 4.

Figure 4:
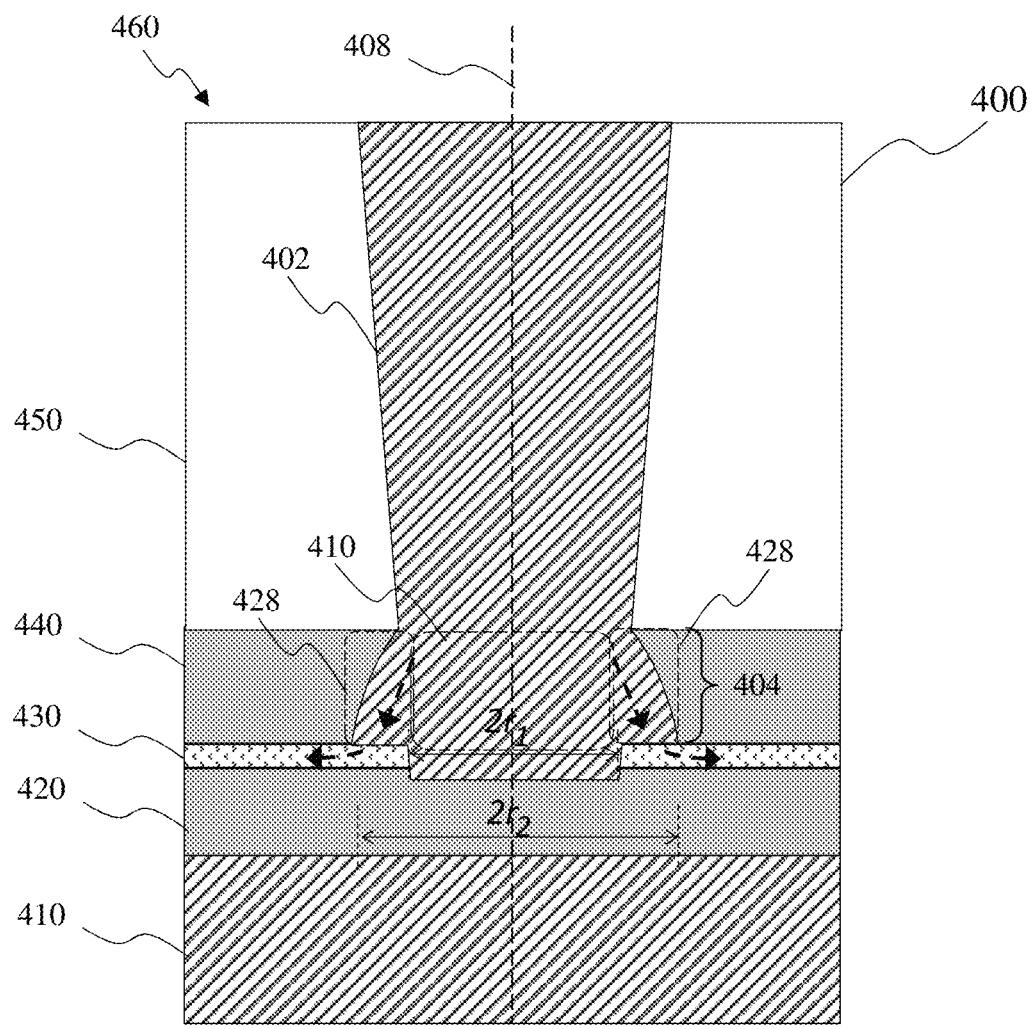
FIG. 4 shows a partial cross-sectional view of a semiconductor device according to various embodiments.

FIG. 4 shows a partial cross-sectional view 400 of a semiconductor device 460 according to various embodiments. The semiconductor device 460 may include a conductor 410, an insulator layer 420, a thin film 430, a masking region 440, an ILD layer 450 and a contact plug 402. The insulator layer 420 may be arranged over the conductor 410. The ILD layer 450 may be arranged over the insulator layer 420. The thin film 430 may be provided over the insulator layer 420. The thin film 430 may be formed of a resistive material such as silicon chromium (SiCr), TiN, TaN, metallic mixtures, mixtures of ceramic-metal (cermet), or combinations thereof, in a non-limiting example. The masking region 440 may be provided over the thin film 430 and may at least partially cover the thin film 430. The masking region 440 may include a masking material that may have a higher etch rate than a dielectric material of the ILD layer 450. The masking region 440 may include a masking material, such as a nitride, an oxide, an oxynitride, or combinations thereof. The masking material may be etched away faster than the ILD layer 450 by either dry etch or wet etch. For example, the masking material may be a nitride, for example, silicon nitride, that may be etched away faster than the ILD layer 450 by either dry or wet etching. For example, the masking material may be an oxide or an oxinitride that may be etched away faster than the ILD layer 450 by wet etching. The masking region 440 may be more porous in material composition than the ILD layer 450, so that it has a higher etch rate than the ILD layer 450. The ILD layer 450 may enclose the masking region 440 and the thin film 430. In other words, the thin film 430 and the masking region 440 may be arranged within the ILD layer 450. The contact plug 402 may extend along a vertical axis 408, through the ILD layer 450, through the masking region 440, to contact the thin film 430. The ILD layer 450 may be referred herein as a first ILD layer. The contact plug 402 may extend from another ILD layer, herein referred to as a second ILD layer (not shown in FIG. 4), to connect an interconnect member in the second ILD layer to the thin film 430. The second ILD layer may be arranged above the first ILD layer, and there may be another insulator layer (not shown in FIG. 4) arranged between the first ILD layer and the second ILD layer. The vertical axis 408 may also be referred herein as a longitudinal axis of the contact plug 402. The contact plug 402 may include a bottom portion 404 that lies at least partially within the masking region 440. The bottom portion 404 may have a central portion 410 and a peripheral portion that surrounds the central portion 410. The peripheral portion may also be referred herein as a lateral member 428. The lateral member 428 may extend along a horizontal plane that is at least substantially perpendicular to the vertical axis 408, into the masking region 440. The lateral member 428 may contact the thin film 430. The contact plug 402 may ideally terminate at a surface of the thin film 430. Alternatively, the contact plug 402 may extend into the thin film 430. The contact plug 402 may be said to have a rivet profile. The lateral member 428 may curve outwards, away from the central portion 410. The lateral member 428 may have a convex cross-sectional profile. The lateral member 428 may be symmetric about the vertical axis 408. The surface area of contact between the contact plug 402 and the thin film 430 in the semiconductor device 460, $A_{460}$, may be expressed as:

$$A_{460} = 2\pi \cdot r_1 \cdot t + 2\pi \cdot (r_2^2 - r_1^2) \qquad (3)$$

where $r_2$ denotes a radius of the bottom portion 404 that lies within the masking region 440, and $r_1$ denotes a radius of a central portion 410 that punches through the masking region 440. For comparison with the semiconductor devices 160A and 160B, the same example dimensions described with respect to FIGS. 2A and 2B are applied to Equation (3), i.e. where the thickness of the thin film 130, t, may be about 5 nm; while the radius of the contact plug 102 at the interface between the contact plug 102 and the thin film 130, $r_1$, may be about 0.2 μm, and in addition, $r_2$ may be about 0.22 μm. Applying these example dimensions in Equation (3), the surface area of contact is 0.05906 μm², which is about 9.4 times the surface area of contact of the semiconductor device 160B. While the surface area of contact area may be smaller than the semiconductor device 160A, the fabrication process of the semiconductor device 460 may be simpler and may require only one mask adder.

FIGS. 5A to 5I show simplified cross-sectional views that illustrate a method of forming a semiconductor device 560 according to various embodiments. The semiconductor device 560 may include the semiconductor device 460.

Figure 5A:
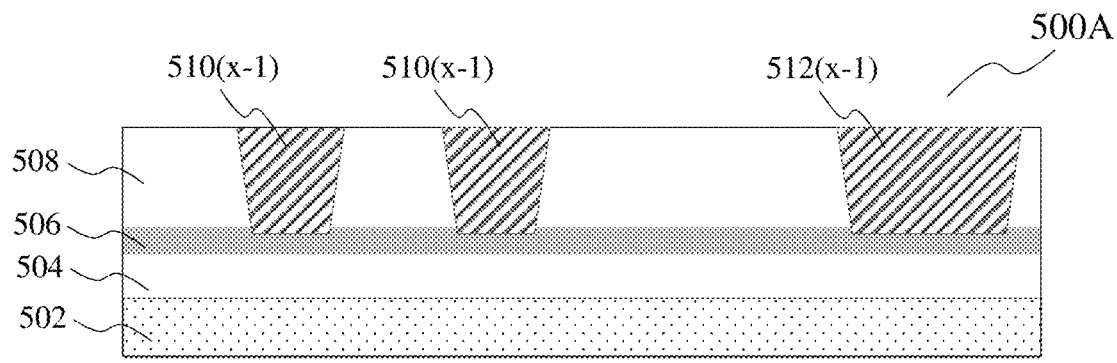
FIGS. 5A to 5I show simplified cross-sectional views that illustrate a method of forming a semiconductor device according to various embodiments.

FIG. 5A shows a process 500A. The process 500A may include providing a substrate 502, a base ILD layer 504, a base insulator layer 506, and a second base ILD layer 508. The base ILD layer 504 may be arranged over the substrate 502. The base insulator layer 506 may be arranged over the base ILD layer 504. The second base ILD layer 508 may be arranged over the base insulator layer 506. The substrate 502 may include a semiconductor material such as silicon, or germanium, or gallium arsenide. The base ILD layer 504 and the second base ILD layer 508 may each include one or more dielectric materials, such as low-k dielectrics, for example, SiCOH, tetraethyl orthosilicate (TEOS), silicon oxide, silicon nitride etc. The base insulator layer 506 may include an electrically insulating material, such as silicon oxide, silicon nitride, silicon oxynitride or combinations thereof.

The process 500A may include forming interconnect members in the second base ILD layer 508. The interconnect members may be formed of metals such as copper, copper alloy, aluminum, or a combination thereof. The interconnect members may include a device interconnect member 510 ($x-1$) and a logic interconnect member 512($x-1$). The device interconnect member 510($x-1$) may include the conductor 410 shown in FIG. 4. The process 500A may include smoothing the top surfaces of the second base ILD layer 508 and the interconnect members, for example, by chemical mechanical planarization.

Figure 5B:
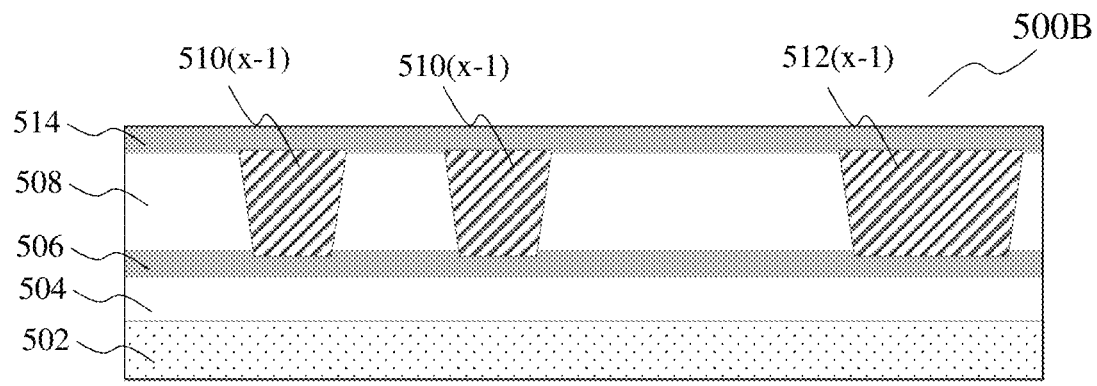

FIG. 5B shows a process 500B. The process 500B may include forming an insulator layer 514 over the second base ILD layer 508. The insulator layer 514 may include the insulator layer 420 shown in FIG. 4. The process 500B may include depositing an electrically insulating material over the second base ILD layer 508 to form the insulator layer 514. The insulator layer 514 may be identical, or at least similar, in composition, as the base insulator layer 506. The insulator layer 514 may include a nitride, for example silicon nitride, silicon oxynitride, or combinations thereof. A nitride-based insulator layer 514 may be referred herein as a nitride block insulator. The insulator layer 514 may have a thickness ranging from about 300 Å to about 1000 Å, in a non-limiting example.

Figure 5C:
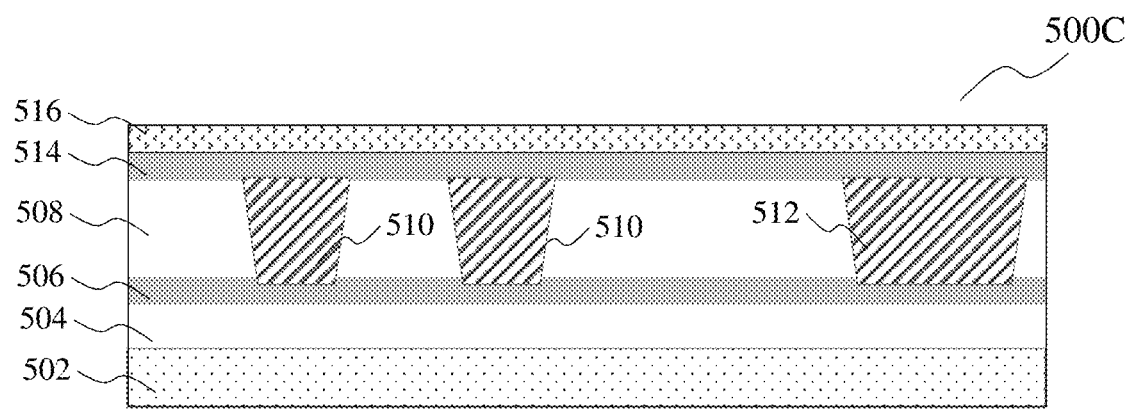

FIG. 5C shows a process 500C. The process 500C may include forming a thin film layer 516 over the insulator layer 514. The process 500C may include depositing a thin layer of metal or a metal alloy, or a combination thereof, such as chromium (Cr) or silicon chromium (SiCr). The thin film layer 516 may be further processed into a thin film passive component in subsequent steps.

Figure 5D:
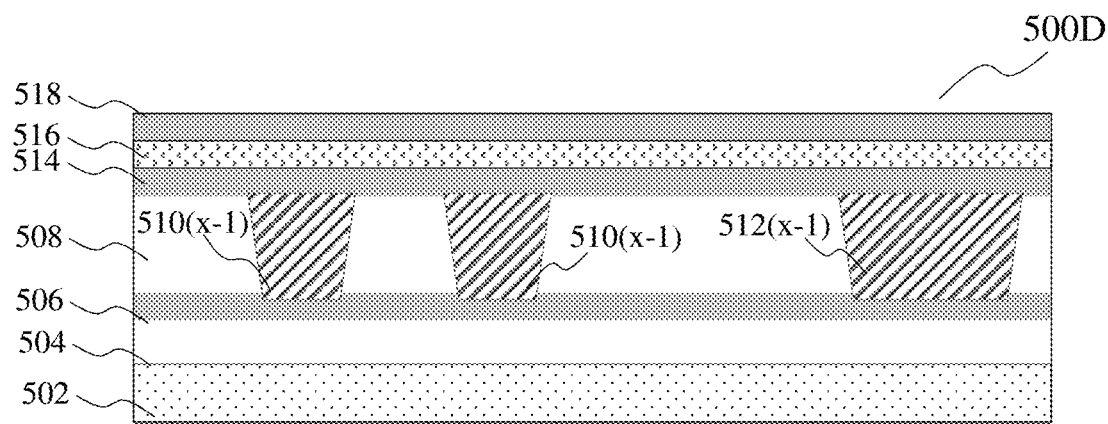

FIG. 5D shows a process 500D. The process 500D may include forming a hard mask 518, also referred herein as a masking layer, over the device resulting from the process 500C. The process 500D may include depositing a hard mask material, for example, a nitride-based material identical to, or similar to the insulator layer 514. The hard mask 518 may be arranged over the thin film layer 516.

Figure 5E:
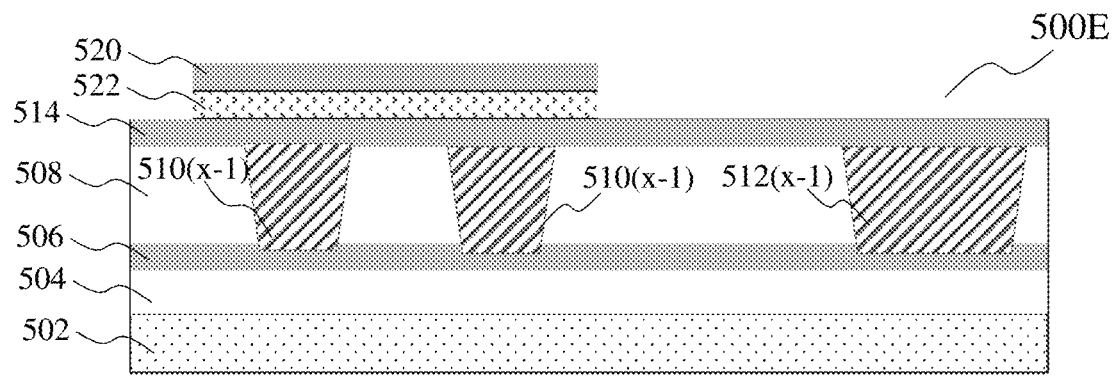

FIG. 5E shows a process 500E. The process 500E may include patterning the hard mask 518 to form a masking region 520, by etching the hard mask 518. The process 500E may also include patterning the thin film layer 516 to form a thin film 522, by etching the thin film layer 516. The thin film 522 may function as a passive circuit component, such as a thin film resistor or a thin film capacitor, in the semiconductor device 560. The set up for carrying out the process 500E will be described in further details with respect to FIG. 6.

Figure 5F:
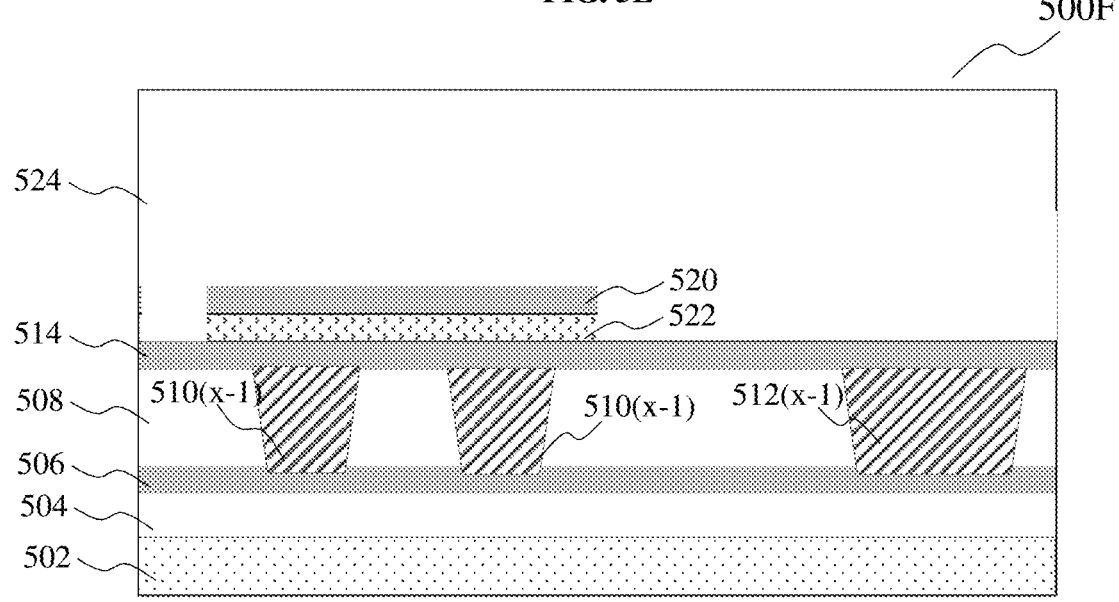

FIG. 5F shows a process 500F. The process 500F may include forming a first ILD layer 524. The process 500F may include depositing a dielectric material over the insulator layer 514, the thin film 522 and the masking region 520. The dielectric material may include, for example, SiCOH, tetra-ethyl orthosilicate (TEOS), silicon oxide, silicon nitride, or combinations thereof. The first ILD layer 524 may be identical in composition, as the base ILD layer 504 and the second base ILD layer 508.

Figure 5G:
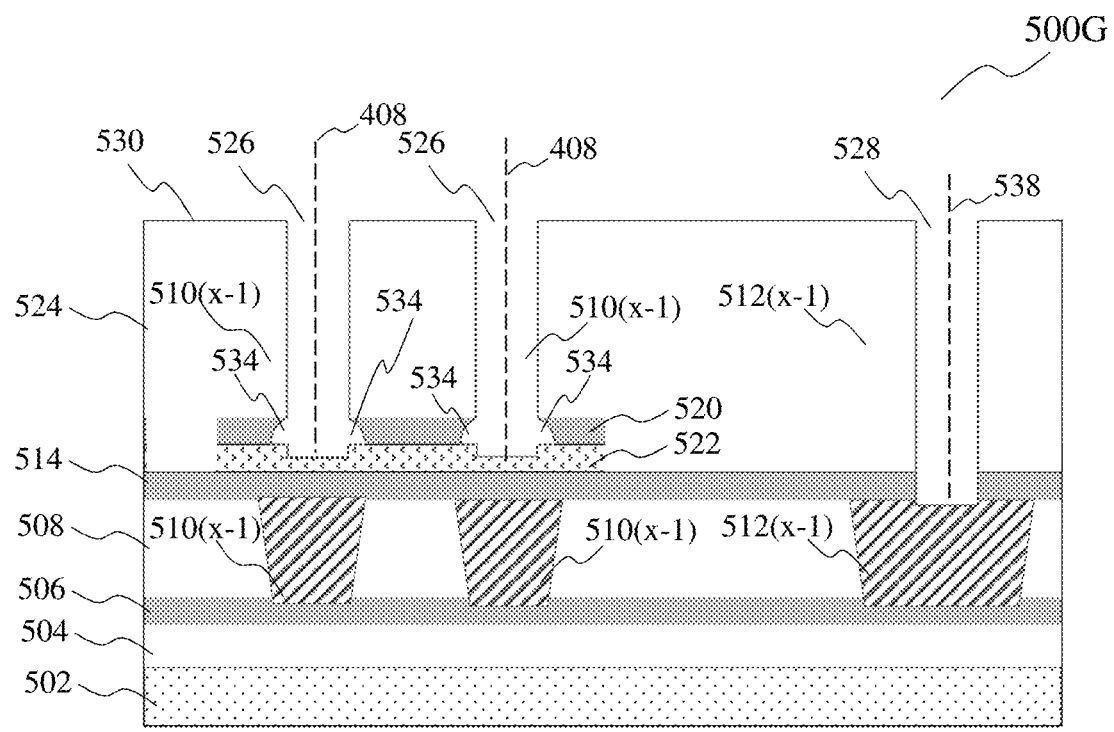

FIG. 5G shows a process 500G. The process 500G may include forming one or more vias in the first ILD layer 524, by an etching process, such as reactive ion etching. The vias may include a device via 526 and a logic via 528. The device via 526 may extend from a top surface 530 of the first ILD layer 524, vertically down along a vertical axis 408, to the thin film 522. The device via 526 may include lateral extensions 534 into the masking region 520. The etching process for forming the device via 526 may include removing the dielectric material along the vertical axis 408 in the first ILD layer 524 until the etchant reaches the masking region 520. By continuing the etching process after reaching the masking region 520, the etchant may reach into the masking region 520 to create a recess in the masking region 520. As the etching process continues, the recess in the masking region 520 may enlarge, thereby exposing a larger surface area of the masking region 520 to the etchant. The recess in the masking region 520 may enlarge as the masking region 520 may be more susceptible to reaction with the etchant gases, as compared to the material in the first ILD layer 524. The recess in the masking region 520 may also enlarge due to differences in the density of the masking region 520 as compared to the density of material in the first ILD layer 524. As a result, the recess may extend along a horizontal plane parallel to a plane of the masking region 520 (and at least substantially perpendicular to the vertical axis 408), into the masking region 520, resulting in the lateral extensions 534. The ratio of the etchant gases may be optimized such that the etch rate of the masking region 520 may be faster than the etch rate of the dielectric material in the first ILD layer 524. The device via 526 may further extend into the thin film 522.

The logic via 528 may extend from the top surface 530 of the first ILD layer 524, vertically down along a second vertical axis 538, to the logic interconnect member 512($x-1$). The second vertical axis 538 may be parallel to the vertical axis 408. The second vertical axis 538 may be laterally offset from the thin film 522 and the masking region 520. In other words, the logic via 528 does not pass through the thin film 522 and the masking region 520. The logic via 528 extends through a region of the first ILD layer 524 that may be devoid of device components, for example, may solely consist of dielectric material. The logic via 528 may have an at least substantially uniform width along its entire length. The logic via 528 may also have an at least substantially uniform cross-sectional area along the second vertical axis 538.

Figure 5H:
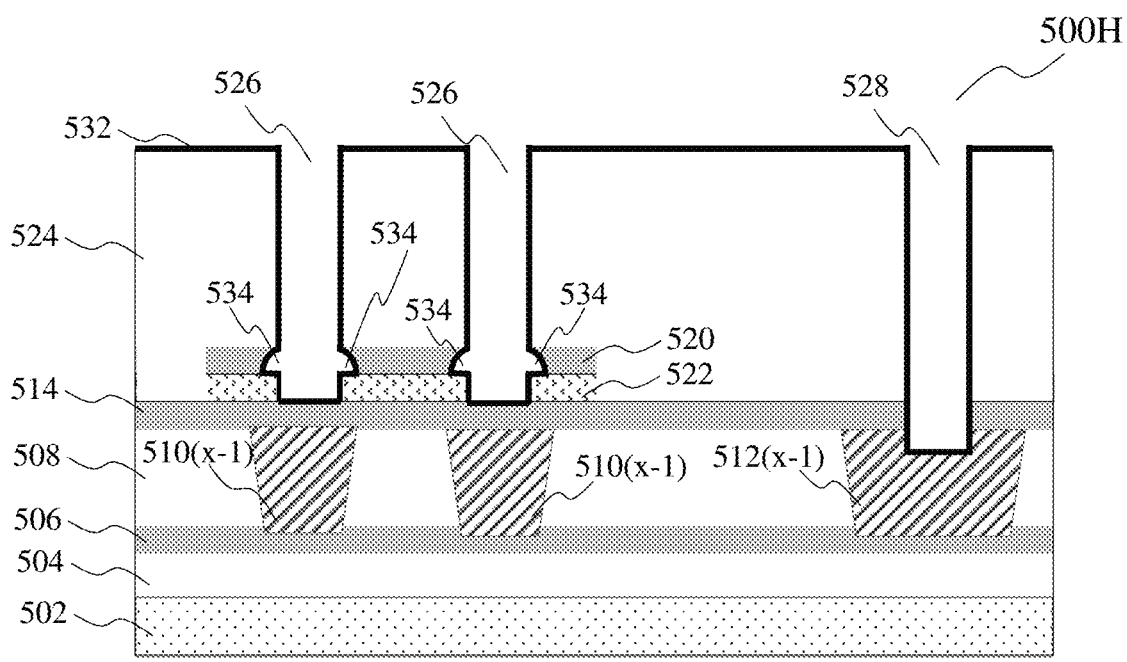

FIG. 5H shows a process 500H. The process 500H may include depositing a thin layer of the lining metal 532 over the device resulting from the process 500G. The lining metal 532 may coat exposed surfaces of the device, including surfaces of the device via 526 and the logic via 528. The lining metal 532 may include a conductive metal, such as tantalum nitride and tantalum.

Figure 5I:
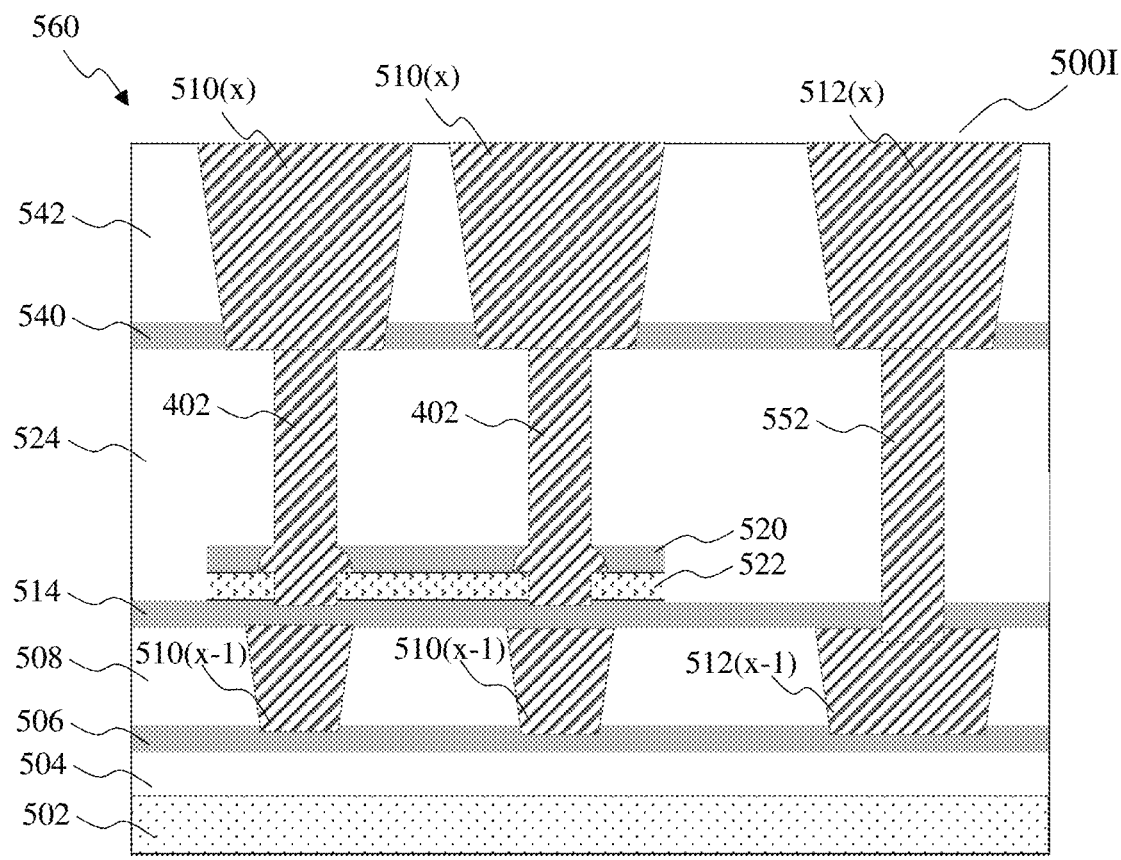

FIG. 5I shows a process 500I, as well as a cross-sectional view of the semiconductor device 560. The process 500I may include depositing a metal into the device via 526 and the logic via 528. The metal deposited into the device via 526 may form the contact plug 402. The metal deposited into the lateral extension 534 may form the lateral member 428 of the contact plug 402. The metal deposited into the logic via 528 may form a second contact plug 552. The process 500I may further include forming a further insulator layer 540, a second ILD layer 542, and interconnect members in the second ILD layer 542. The further insulator layer 540 may be provided over the first ILD layer 524 after planarization, for example, by chemical-mechanical planarization, of the first ILD layer 524. Similar to the second base ILD layer 508, the interconnect members in the second ILD layer 542 may include a device interconnect member 510($x$) and a logic interconnect member 512($x$). The interconnect members in the second ILD layer 542 may overlap the corresponding interconnect members in the second base ILD layer 508, such that the contact plug 402 connects the device interconnect member 510($x$) in the second ILD layer 542. The bottom of the contact plug 402 may or may not punch through the insulator layer 514. The contact plug 402 may connect to the device interconnect member 510(x−1) in the second base ILD layer 508, and the second contact plug 552 connects the logic interconnect member 512(x) in the second ILD layer 542 to the logic interconnect member 512(x−1) in the second base ILD layer 508.

Figure 6:
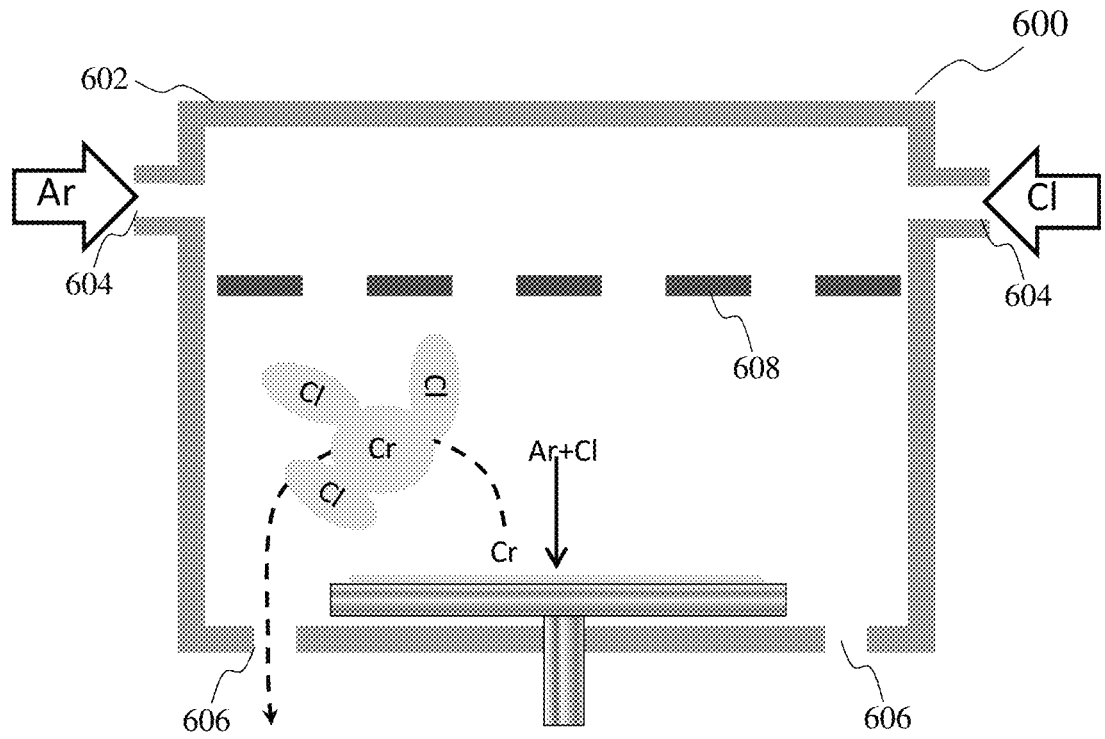
FIG. 6 shows a schematic view of a set up for carrying out a process described in FIG. 5E.

FIG. 6 shows a schematic view 600 of a set up for carrying out the process 500E. The etching process may be carried out in a gas chamber 602. The gas chamber 602 may include one or more inlets 604 and one or more outlets 606. Etchant gases may be introduced into the gas chamber 602 through the one or more inlets 604. The device resulting from the process 500D may be placed in the gas chamber 602. An ion trapping plate 608 may be arranged above the device, before the etchant gases are injected into the gas chamber 602. The ion trapping plate 608 may include a plurality of uniformly spaced holes, for distributing the etchant gases uniformly across the device. The etchant gases may include argon and chlorine. The etchant gases may pass through the through holes to react with the thin film layer and the hard mask. Parts of the thin film layer 516 and the hard mask 518 may become ions and may exit the gas chamber 602 through the one or more outlets 606.

Figure 7:
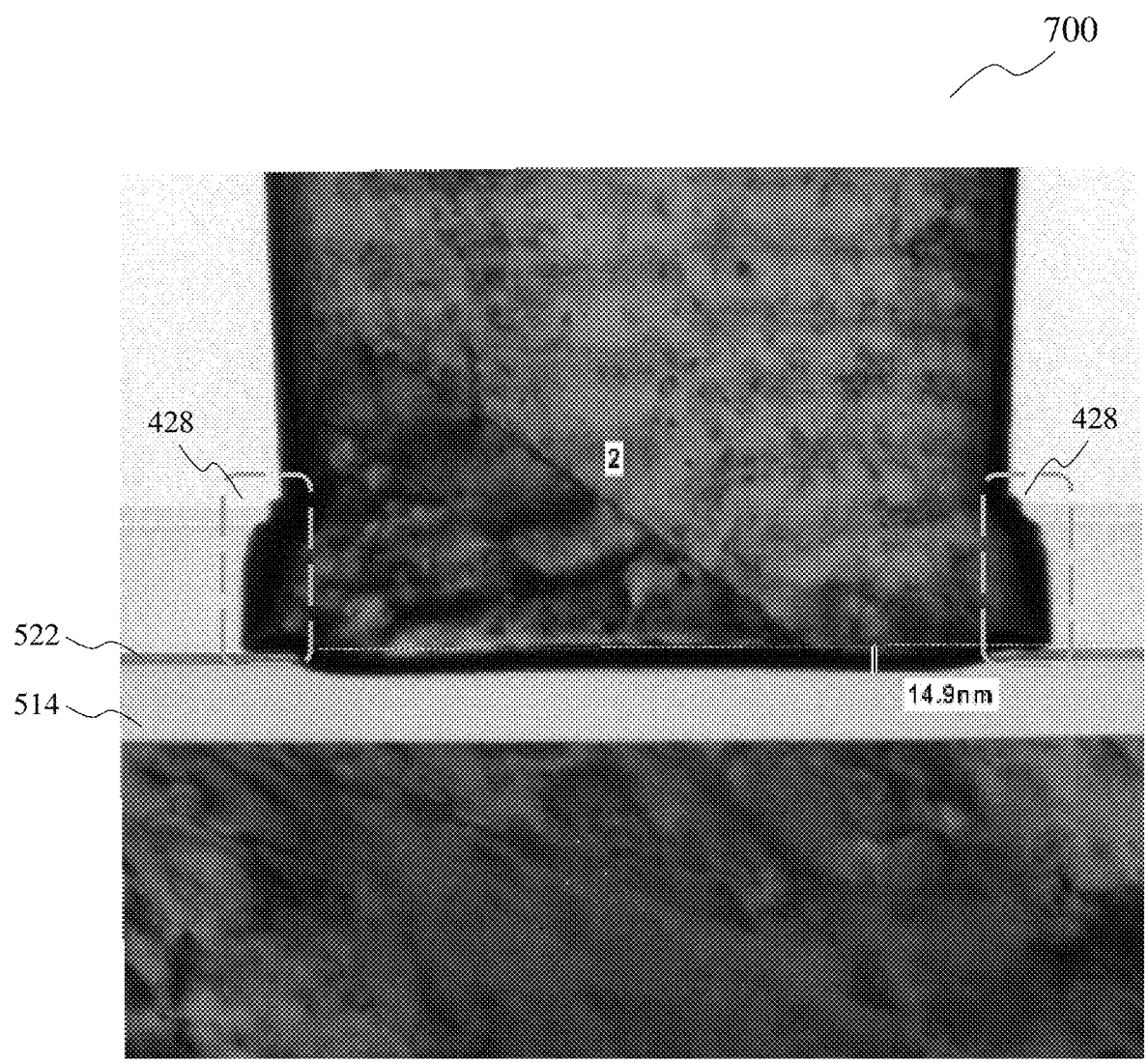
FIG. 7 shows a transmission electron microscopy (TEM) image of a contact plug in a semiconductor device according to various embodiments.

FIG. 7 shows a transmission electron microscopy (TEM) image 700 of a contact plug in a semiconductor device according to various embodiments, for example the contact plug 402 in the semiconductor device 460 or 560. The lateral member 428 is marked out in the TEM image 700. The contact plug may punch through the thin film 522.

Figure 8:
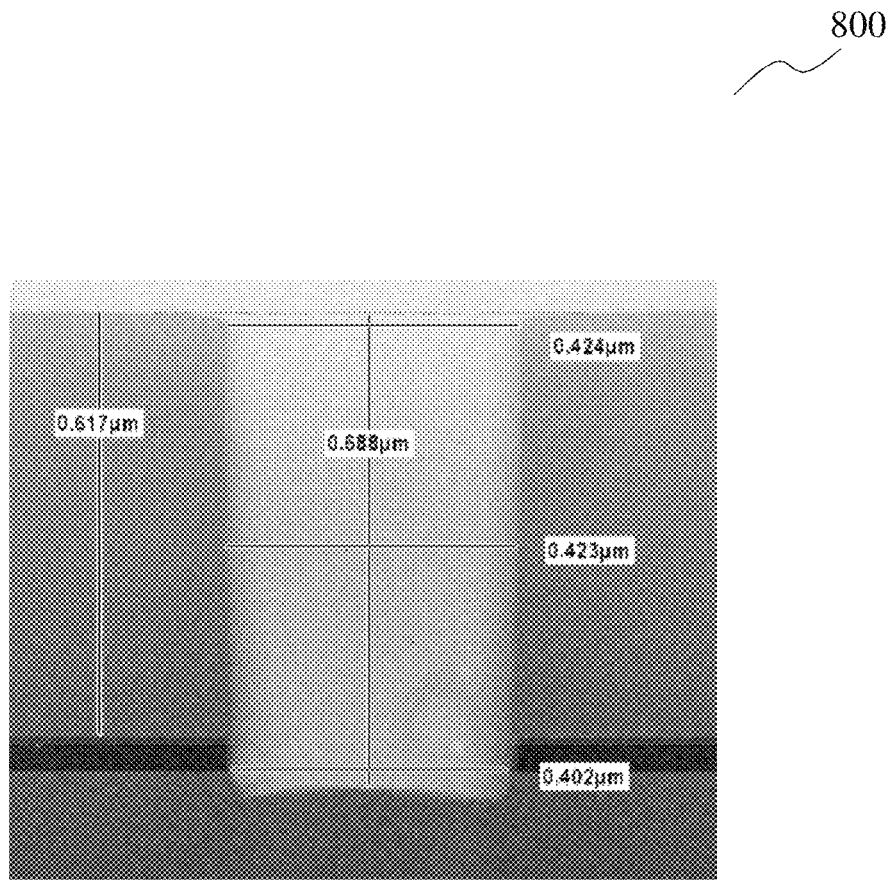
FIG. 8 shows a TEM image of a second contact plug in a semiconductor device according to various embodiments.

FIG. 8 shows a TEM image 800 of a second contact plug in a semiconductor device according to various embodiments, for example the second contact plug 552 in the semiconductor device 560.

Figure 9:
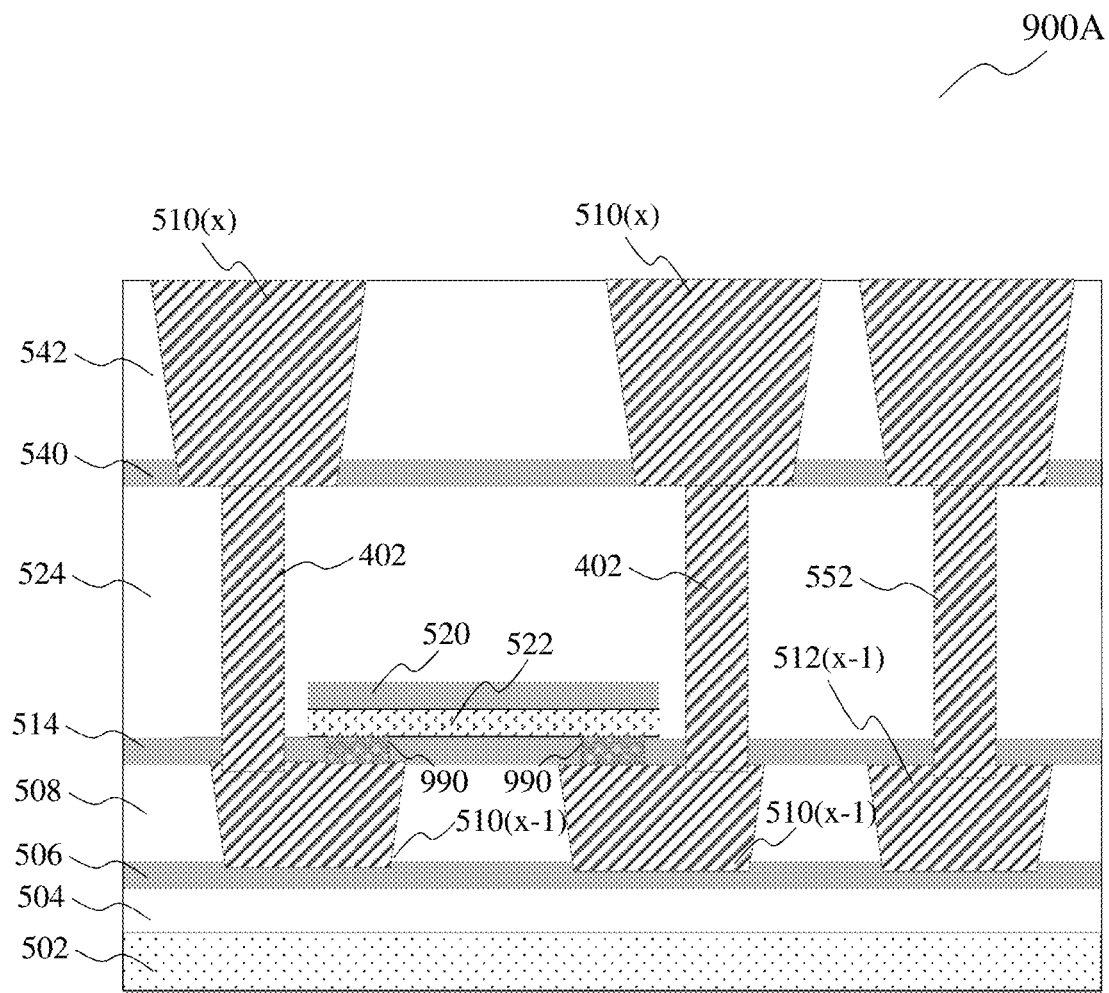
FIG. 9 shows a cross-sectional schematic view of a thin film based semiconductor device that has a bottom via pick up configuration.

FIG. 9 shows a cross-sectional schematic view of a thin film based semiconductor device that has a bottom via pick up configuration. In the bottom via pick up configuration, the thin film 522 may be connected to a device interconnect member 510(x−1) in the second base ILD layer 508 through a via 990. The same device interconnect member 510(x−1) may be connected to a device interconnect member 510(x) in the second ILD layer 542. The semiconductor device 560 shown in FIG. 5I has a top via pick up configuration. The semiconductor device shown in FIG. 9 and the semiconductor device 560 were processed and run on the same wafers for evaluation purpose. The electrical test (ET) data are shown in FIGS. 10 to 12.

Figure 10:
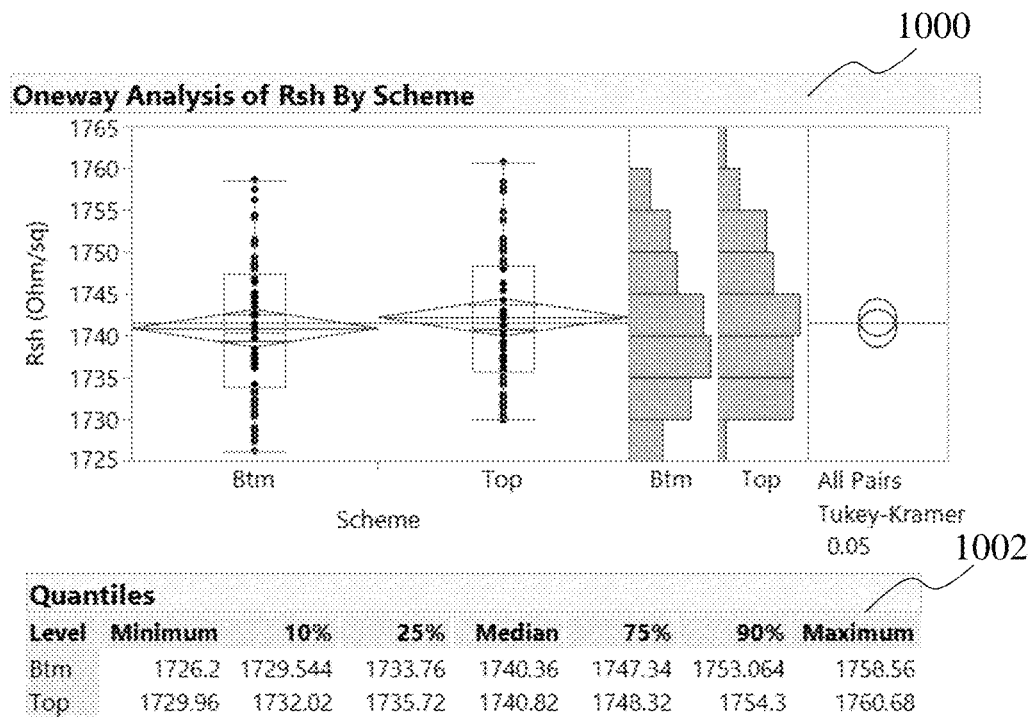
FIG. 10 shows an analysis of sheet resistance of the thin film based semiconductor devices of FIG. 9 and a semiconductor device according to various embodiments.

FIG. 10 shows an analysis of sheet resistance (Rsh) of the thin film based semiconductor devices of FIG. 9 and the semiconductor device 560. Sheet resistance is a measure of resistance of thin films that are nominally uniform in thickness. FIG. 10 includes a graph 1000 having a vertical axis indicating sheet resistance in the units of Ohm/square. FIG. 10 also includes the distribution of sheet resistance variations and a table 1002 that lists the sheet resistance of each of the thin film based semiconductor device of FIG. 9 and the semiconductor device 560, at a plurality of quantiles. The graph 1000 and the table 1002 show that the top via pick up configuration has a comparable sheet resistance as compared to the bottom via pick up configuration.

Figure 11:
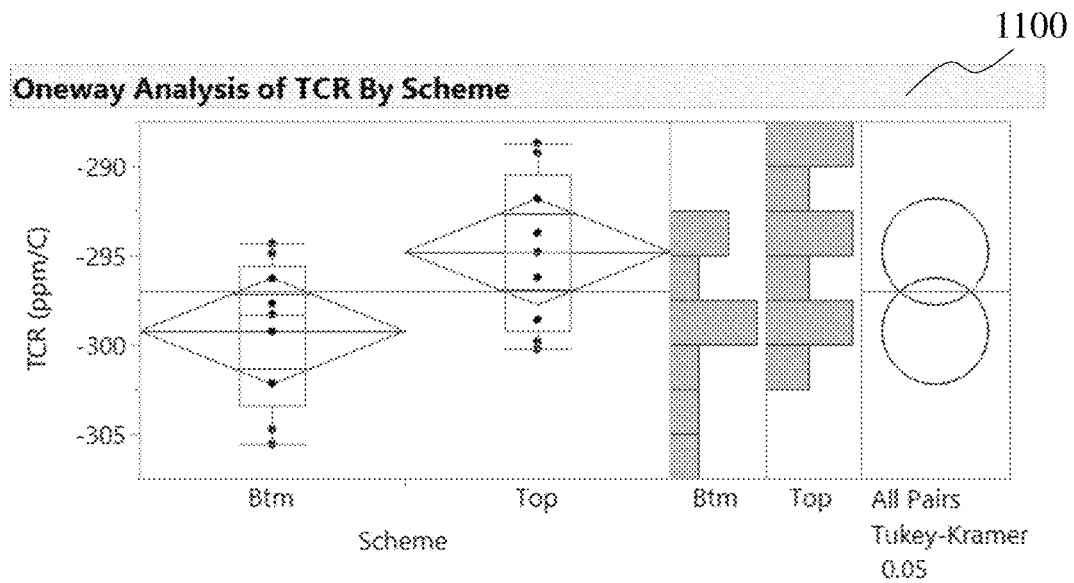
FIG. 11 shows an analysis of the temperature coefficient of resistance of the thin film based semiconductor devices of FIG. 9 and a semiconductor device according to various embodiments.

FIG. 11 shows an analysis of the TCR of the thin film based semiconductor devices of FIG. 9 and the semiconductor device 560. FIG. 11 includes a graph 1100 having a vertical axis indicating TCR in the units of ppm/C. The graph 1100 shows that the TCR of the top via pick up configuration is slightly higher and overlapping by ~5 ppm/C than the TCR of the bottom via pick up configuration.

Figure 12:
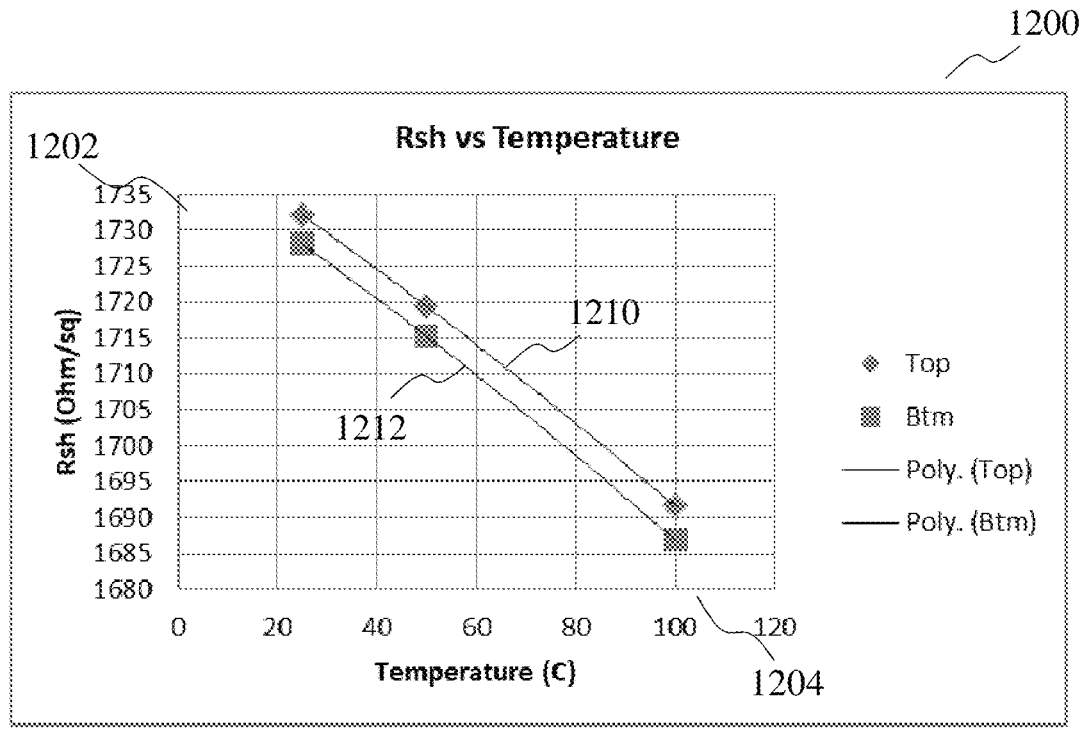
FIG. 12 shows a graph that plots the dependence of sheet resistance on temperature.
Figure 13:
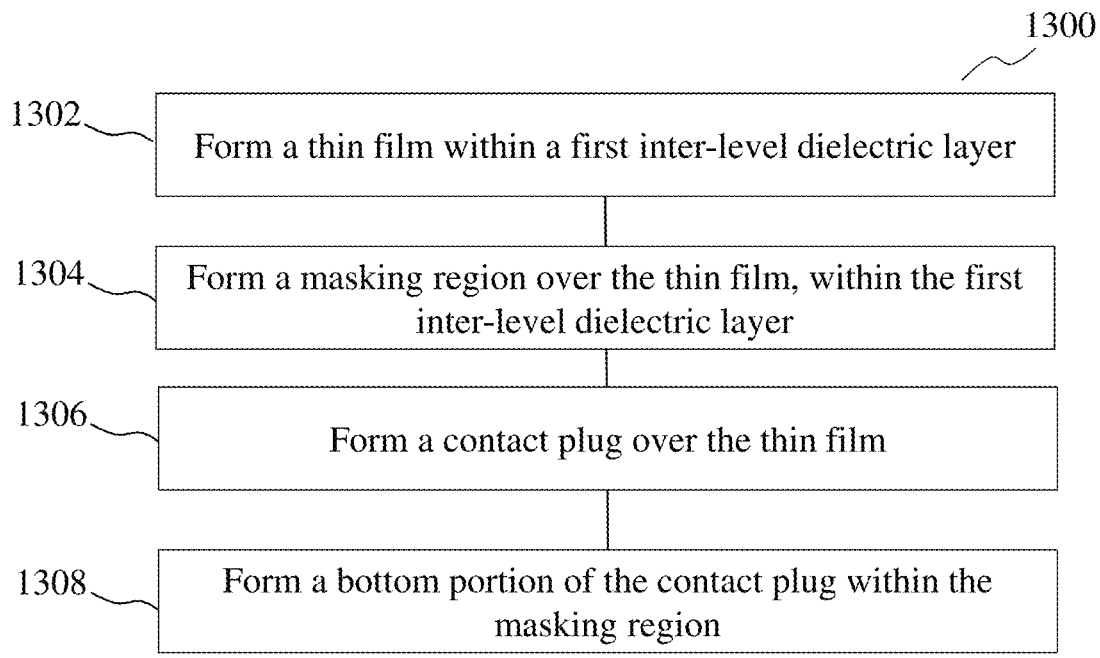
FIG. 13 shows a flow diagram of a method of forming a semiconductor device according to various embodiments.

FIG. 12 shows a graph 1200 of the dependence of sheet resistance on temperature on one particular TFR. The graph 1200 has a vertical axis 1202 indicating sheet resistance in units of Ohm/sq, and a horizontal axis 1204 indicating temperature in units of degrees Celsius. The graph 1200 includes a first plot 1210 of the dependence of the top pickup and a second plot 1212 of the dependence of the bottom pick up. The TCR of the top via pick up configuration is slightly higher than the TCR of the bottom via pick up configuration FIG. 13 shows a flow diagram 1300 of a method of forming a semiconductor device according to various embodiments. The method may include arranging a thin film within a first ILD layer, in 1302. The method may include arranging a masking region over the thin film, within the first ILD layer, in 1304. The masking region may have a higher etch rate than the first ILD layer. In other words, the masking region may be removed at a faster rate than the first ILD layer by etching, for example dry etching of wet etching. The method may include forming a contact plug, in 1306. The contact plug may extend along a vertical axis, from a second ILD layer to the thin film. The method may include forming a bottom portion of the contact plug within the masking region, in 1308. The bottom portion may include a lateral member that extends along a horizontal plane at least substantially perpendicular to the vertical axis. The lateral member may contact the thin film.

According to various embodiments, 1308 may include etching the first ILD layer to create a via that extends along the vertical axis to reach the masking region, etching the masking region through the via to create a lateral cavity that extends from the via in the horizontal plane, and depositing an electrical contact material into the via and into the lateral cavity. Etching the masking region through the via to create the lateral cavity may include etching the masking region with a mixture of etching gases that etches the masking region faster than it etches the first ILD layer. The electrical contact material may include a metal. The lateral member of the contact plug may include the electrical contact material deposited into the lateral cavity.

According to various embodiments, the method may further include forming a second contact plug. The second contact plug may extend along a second vertical axis, from the second ILD layer to a lower ILD layer arranged under the first ILD layer. The lower ILD layer may be the second base ILD layer. The second contact plug may be laterally offset from the thin film. The second plug may have an at least substantially uniform cross-sectional area along the second vertical axis.

According to various embodiments, the method may further include forming the first ILD layer, forming an insulator layer over the first ILD layer, and forming the second ILD layer over the insulator layer.

According to various embodiments, the method may further include forming a first interconnect member and a second interconnect member in a lower ILD layer. The lower ILD layer may be the second base ILD layer. The method may further include forming an insulator layer over the lower ILD layer, forming a thin film layer over the insulator layer, and forming a masking layer over the thin film layer. The method may further include etching the masking layer to form the masking region, and etching the thin film layer to form the thin film. The method may further include depositing a dielectric material over the masking region, the thin film and the insulator layer, to form the first ILD layer.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A semiconductor device comprising:
   a thin film arranged within a first inter-level dielectric layer;
   a masking region arranged over the thin film, within the first inter-level dielectric layer, wherein the masking region is structured to have a higher etch rate than the first inter-level dielectric layer; and
   a contact plug extending along a vertical axis from a second inter-level dielectric layer to the thin film,
   wherein a bottom portion of the contact plug is surrounded by the masking region, the bottom portion comprising a lateral member that extends along a horizontal plane at least substantially perpendicular to the vertical axis, the lateral member being in contact with the thin film.

2. The semiconductor device of claim 1, further comprising:
   the first inter-level dielectric layer;
   the second inter-level dielectric layer; and
   an insulator layer arranged between the first inter-level dielectric layer and the second inter-level dielectric layer.

3. The semiconductor device of claim 1, wherein the contact plug connects an interconnect member in the second inter-level dielectric layer to one of the thin film and an interconnect member in the first inter-level dielectric layer.

4. The semiconductor device of claim 1, wherein the thin film is a thin film resistor.

5. The semiconductor device of claim 1, wherein the thin film comprises silicon chromium (SiCr), TiN, TaN, metallic mixtures, mixtures of ceramic-metal (cermet), or combinations thereof.

6. The semiconductor device of claim 1, wherein the masking region comprises nitride, oxide, oxynitride, or combinations thereof.

7. The semiconductor device of claim 1, wherein the lateral member is symmetric about the vertical axis.

8. The semiconductor device of claim 1, wherein the lateral member has a convex cross-sectional profile.

9. The semiconductor device of claim 1, wherein the contact plug extends into the thin film.

10. The semiconductor device of claim 1, further comprising:
    a second contact plug extending along a second vertical axis, from the second inter-level dielectric layer to a lower inter-level dielectric layer arranged under the first inter-level dielectric layer,
    wherein the second contact plug is laterally offset from the thin film;
    wherein the second contact plug has an least substantially uniform cross-sectional area along the second vertical axis.

11. A method of forming a semiconductor device, the method comprising:
    forming a thin film within a first inter-level dielectric layer;
    forming a masking region over the thin film, within the first inter-level dielectric layer, wherein the masking region is structured to have a higher etch rate than the first inter-level dielectric layer;
    forming a contact plug, the contact plug extending along a vertical axis from a second inter-level dielectric layer to the thin film; and forming a bottom portion of the contact plug within the masking region, the bottom portion comprising a lateral member that extends along a horizontal plane at least substantially perpendicular to the vertical axis, the lateral member being in contact with the thin film.

12. The method of claim 11, wherein the thin film is a thin film resistor.

13. The method of claim 11, wherein forming the bottom portion of the contact plug comprises:
    etching the first inter-level dielectric layer to create a via that extends along the vertical axis to reach the masking region;
    etching the masking region through the via, to create a lateral cavity that extends from the via in the horizontal plane; and
    depositing an electrical contact material into the via and into the lateral cavity.

14. The method of claim 13, wherein etching the masking region through the via to create the lateral cavity comprises etching the masking region and the first inter-level dielectric layer with a mixture of etching gases such that etching of the masking region is faster than etching of the first inter-level dielectric layer.

15. The method of claim 13, wherein the lateral member of the contact plug comprises the electrical contact material deposited into the lateral cavity.

16. The method of claim 11, further comprising:
    forming a second contact plug, the second contact plug extending along a second vertical axis from the second inter-level dielectric layer to a lower inter-level dielectric layer arranged under the first inter-level dielectric layer,
    wherein the second contact plug is laterally offset from the thin film;
    wherein the second contact plug has an least substantially uniform cross-sectional area along the second vertical axis.

17. The method of claim 11, further comprising:
    forming a first interconnect member and a second interconnect member in a lower inter-level dielectric layer;
    forming an insulator layer over the lower inter-level dielectric layer;
    forming a thin film layer over the insulator layer; and
    forming a masking layer over the thin film layer.

18. The method of claim 17, further comprising:
    etching the masking layer to form the masking region; and
    etching the thin film layer to form the thin film.

19. The method of claim 18, further comprising:
    depositing a dielectric material over the masking region, the thin film, and the insulator layer, to form the first inter-level dielectric layer.

20. The method of claim 11, further comprising:
    forming the first inter-level dielectric layer;
    forming an insulator layer over the first inter-level dielectric layer; and
    forming the second inter-level dielectric layer over the insulator layer.

* * * * *